(12) United States Patent
Eugene Lee et al.

(10) Patent No.: US 9,691,748 B2
(45) Date of Patent: *Jun. 27, 2017

(54) FORMING A PANEL OF TRIPLE STACK SEMICONDUCTOR PACKAGES

(71) Applicant: Texas Instruments Incorporated, Dallas, TX (US)

(72) Inventors: Lee Han Meng @ Eugene Lee, Johor (MY); Anis Fauzi Bin Abdul Aziz, Melaka (MY); Sueann Lim Wei Fen, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,192

(22) Filed: Jan. 5, 2016

(65) Prior Publication Data

US 2016/0133617 A1 May 12, 2016

Related U.S. Application Data

(62) Division of application No. 14/532,743, filed on Nov. 4, 2014, now Pat. No. 9,324,640.

(51) Int. Cl.
*H01L 25/00* (2006.01)
*H01L 25/07* (2006.01)
(Continued)

(52) U.S. Cl.
CPC .......... *H01L 25/50* (2013.01); *H01L 21/4825* (2013.01); *H01L 21/4853* (2013.01); *H01L 21/561* (2013.01); *H01L 21/565* (2013.01); *H01L 23/49534* (2013.01); *H01L 23/49537* (2013.01); *H01L 23/49551* (2013.01); *H01L 23/49562* (2013.01); *H01L 23/49575* (2013.01); *H01L 23/49844* (2013.01); *H01L 24/34* (2013.01); *H01L 24/85* (2013.01); *H01L 24/97* (2013.01); *H01L 25/071* (2013.01); *H01L 25/165* (2013.01); *H01L 25/18* (2013.01);
(Continued)

(58) Field of Classification Search
CPC .................... H01L 23/49534; H01L 23/49537
See application file for complete search history.

(56) References Cited

U.S. PATENT DOCUMENTS

| | | | |
|---|---|---|---|
| 2007/0249092 A1* | 10/2007 | Joshi | ...................... H01L 23/492 438/107 |
| 2012/0326287 A1* | 12/2012 | Joshi | ................. H01L 23/49548 257/676 |
| 2014/0191334 A1* | 7/2014 | Xue | ........................ H01L 24/40 257/401 |

* cited by examiner

*Primary Examiner* — Yu-Hsi D Sun
(74) *Attorney, Agent, or Firm* — Rose Alyssa Keagy; Charles A. Brill; Frank D. Cimino

(57) ABSTRACT

A method for forming a panel of stacked semiconductor packages includes providing a bottom leadframe (LF) panel including LFs downset each including at least a plurality of terminals. Low side (LS) transistors are attached to the first die attach area. A first clip panel including first clips downset and interconnected are placed on the bottom LF panel. A dielectric interposer is attached on the first clips over the LS transistors. High side (HS) transistors are attached on the interposers. A second clip panel including a plurality of second clips is mated to interconnect to the HS transistors including mating together the second clip panel, first clip panel and bottom LF panel. The LFs can include a second die attach area, and a controller die attached on the second die attach area, and then pads of the controller die wirebonded to the plurality of terminals.

10 Claims, 15 Drawing Sheets

(51) Int. Cl.
    *H01L 23/495*     (2006.01)
    *H01L 21/48*     (2006.01)
    *H01L 23/498*     (2006.01)
    *H01L 25/16*     (2006.01)
    *H01L 21/56*     (2006.01)
    *H01L 23/00*     (2006.01)
    *H01L 25/18*     (2006.01)
    *H01L 23/31*     (2006.01)

(52) U.S. Cl.
    CPC ...... *H01L 23/3121* (2013.01); *H01L 23/4952* (2013.01); *H01L 2224/291* (2013.01); *H01L 2224/2929* (2013.01); *H01L 2224/29339* (2013.01); *H01L 2224/32245* (2013.01); *H01L 2224/48247* (2013.01); *H01L 2224/73265* (2013.01); *H01L 2224/97* (2013.01); *H01L 2924/00014* (2013.01); *H01L 2924/1301* (2013.01); *H01L 2924/1306* (2013.01); *H01L 2924/13055* (2013.01); *H01L 2924/13062* (2013.01); *H01L 2924/13064* (2013.01); *H01L 2924/13091* (2013.01); *H01L 2924/1461* (2013.01)

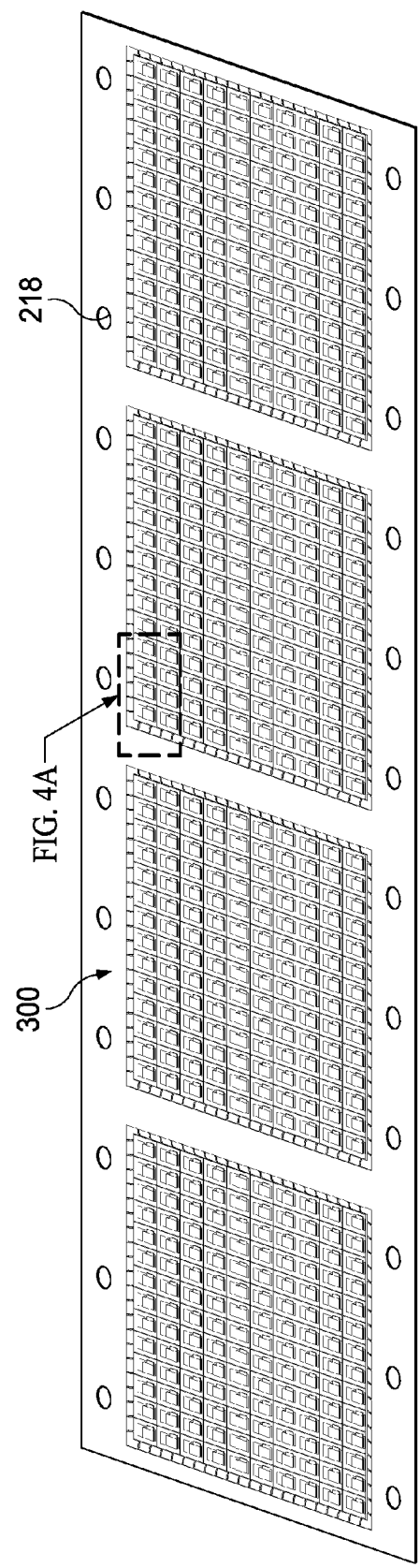

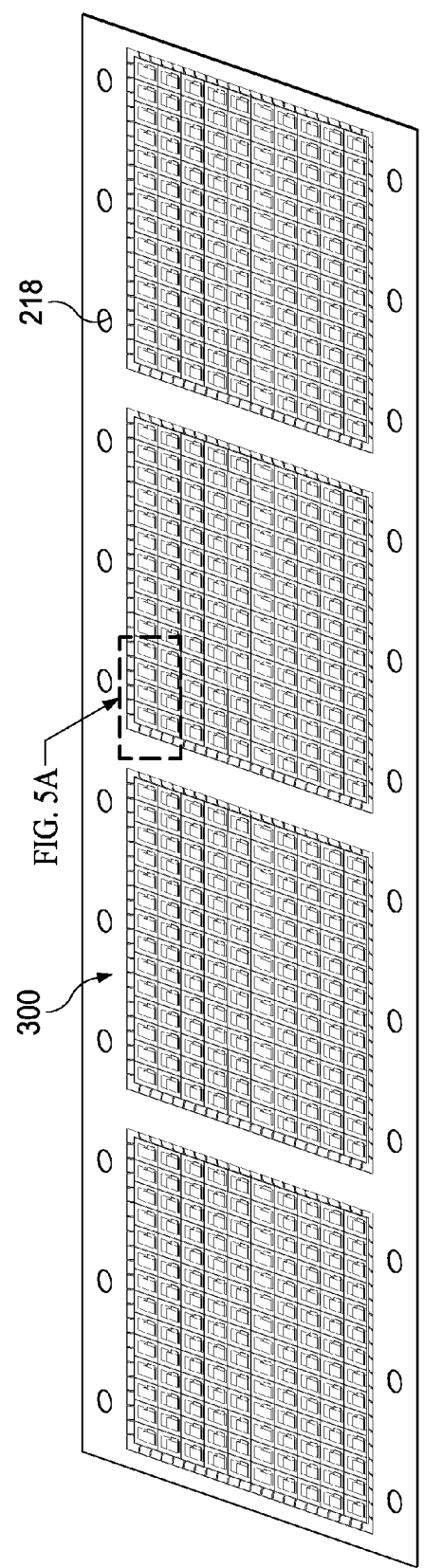

though of US 9,691,748 B2

FORMING A PANEL OF TRIPLE STACK SEMICONDUCTOR PACKAGES

CROSS-REFERENCE TO RELATED APPLICATIONS

This Application is a Divisional of and claims priority to U.S. patent application Ser. No. 14/532,743, filed on Nov. 4, 2014. Said application is herein incorporated by reference in its entirety.

FIELD

Disclosed embodiments relate to Multi-Chip Module (MCM) semiconductor packages including a substrate and a plurality of stacked power devices, and related assembly methods.

BACKGROUND

Demand for semiconductor devices for lower-cost, higher performance, increased miniaturization and greater packaging densities have led to MCM package structures. MCM packages include two or more die and optionally other semiconductor components mounted within a single semiconductor package. The number of dies and other components can be mounted in a vertical manner, a lateral manner, or a combination of a vertical and a lateral manner.

Some MCM packages are MCM power packages that include power metal-Oxide-semiconductor field-effect transistor (MOSFETs, hereafter "power FETs"), sometimes also including a controller die as well in the same package. One known solution for MCM power packages comprises stacked quad-flat no-leads (QFN) modules having a bottom QFN lead frame with a first power FET thereon and at least a first metal clip having a second power FET thereon, where the metal clip(s) are provided in the assembly process from a reel. In the assembly process all clip(s) are attached and stacked on top of the bottom lead frame using a special pick and place machine that involves cutting the copper clips from its reel before attaching the clips one at a time for each MCM power package.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize conventional assembly processes for forming stacked Multi-Chip Module (MCM) power packages having metal clips involves special pick-and-place assembly equipment generally required to handle individual metal clips held in reel form. Attaching metal clips one at a time is recognized to result in poor efficiency reflected in a low output/unit per hour (UPH) production rate. Moreover, attaching metal clips with pick-and-place can result in clip misalignment during reflow process, and a variety of clip handling issues.

Disclosed embodiments include triple stack assembly methods for forming stacked MCM power packages that stack a second clip panel on a downset first clip panel on a downset leadframe (LF) panel. The second clip panel, first clip panel and LF panel all generally include alignment holes in at least one of their rails (long side rail and/or side rail), and the second clip panel, first clip panel and LF panel are generally mated together by a suitable jig apparatus utilizing the alignment holes for alignment to one another. The first clip panel and LF panel can be thin enough to be compressible so that their flexure during compression molding can be at least about 0.025 mm to ensure essentially no mold bleed at the exposed die attach pad (DAP) generally provided by QFN packages on the package bottom surface, which provides a more direct thermal interface with the mating circuit board surface in its typical end application.

BRIEF DESCRIPTION OF THE DRAWINGS

Reference will now be made to the accompanying drawings, which are not necessarily drawn to scale, wherein:

FIG. 2A is a close-up detailed perspective depiction of a bottom LF panel having a full downset including a plurality of interconnected LFs with low side (LS) field-effect transistors (FETs) shown attached on a first die attach area of the interconnected LFs, while

FIG. 4A is a close-up detailed perspective depiction of interposers on the clips of the downset first clip panel over the LS FETs, while FIG. 4B is a further away perspective depiction of the same, according to an example embodiment.

FIG. 5A is a close-up detailed perspective depiction of HS FETs attached onto the interposers on the clips of the downset first clip panel, while FIG. 5B is a further away perspective depiction of the same, according to an example embodiment.

FIG. 6A is a close-up detailed perspective depiction of a second clip panel mated to the first clip panel and to the bottom LF panel, while

FIG. 8A depicts a MCM unit side view after molding, while

DETAILED DESCRIPTION

Figure 1:
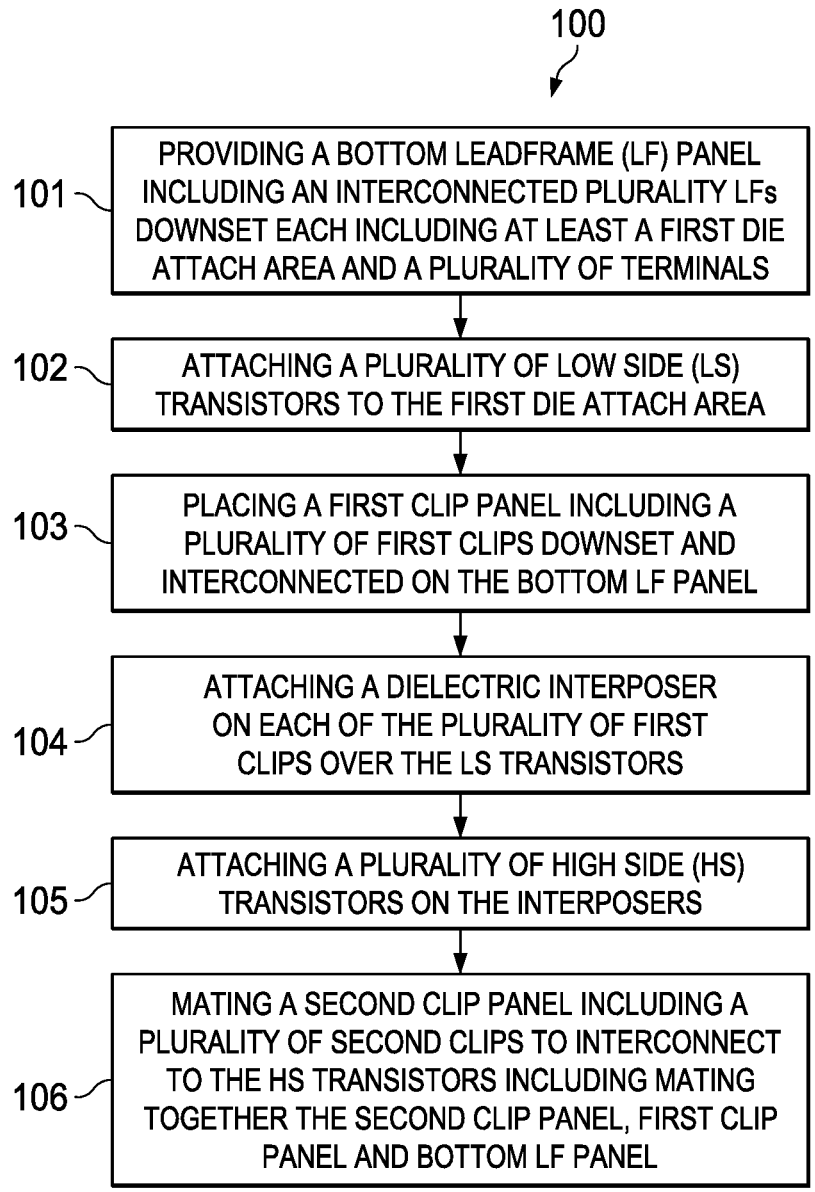
FIG. 1 is a flow chart that shows steps in an example triple stack assembly method for forming a stacked MCM power package, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example triple stack assembly method 100 for forming a stacked MCM power package, according to an example embodiment. The package can comprise a variety of package types including, but not limited to, Quad Flat No Lead (QFN), dual-flat no-lead (DFN), small outline integrated circuit (SOIC), dual in-line package (DIP), transistor outline (TO), thin shrink small outline package (TSSOP), and small outline transistor (SOT). The transistors for disclosed semiconductor packages are generally vertical transistor die (chips), which can be assembled face up or face down depending on the particular product electrical connection requirement.

Step 101 comprises providing a bottom LF panel including an interconnected plurality of LFs downset each including at least a first die attach area and typically also a second die attach area, and a plurality of terminals. The "downset" of a LF or clip as used herein refers to the vertical distance between a major portion of the clip or LF to the lead portion of the clip or LF. Step 102 comprises attaching a plurality of singulated LS transistors to the respective first die attach area. Any suitable die attach material may generally be used.

Step 103 comprises placing a first clip panel including a plurality of first clips downset and interconnected to contact the LS transistors on the bottom LF panel. There is generally solder provided to make the contacts between the clips and bond pads of the LS transistors, and although not explicitly disclosed, there is generally solder between other clip to transistor contacts described below.

Step 104 comprises attaching a singulated dielectric interposer on each of the plurality of first clips over the LS transistors. Step 105 comprises attaching a plurality of singulated HS transistors on the interposers. Step 106 comprises mating a second clip panel including a plurality of second clips to interconnect to the HS transistors including mating together the second clip panel, first clip panel and bottom LF panel. Optionally, the controller die may be attached to second die areas on the bottom LF after step 107. The controller die can then be wire bonded to the terminals on the bottom LF. In an example circuit configuration, the HS and LS transistors are both metal-oxide-semiconductor field-effect transistors (MOSFETs) which are stacked in series between VDD and GND, the controller is coupled provides a gate bias for the gates of the HS and LS MOSFET transistors, and the output of the circuit is taken at the common node between the HS transistor and the LS transistor.

Figure 2A:
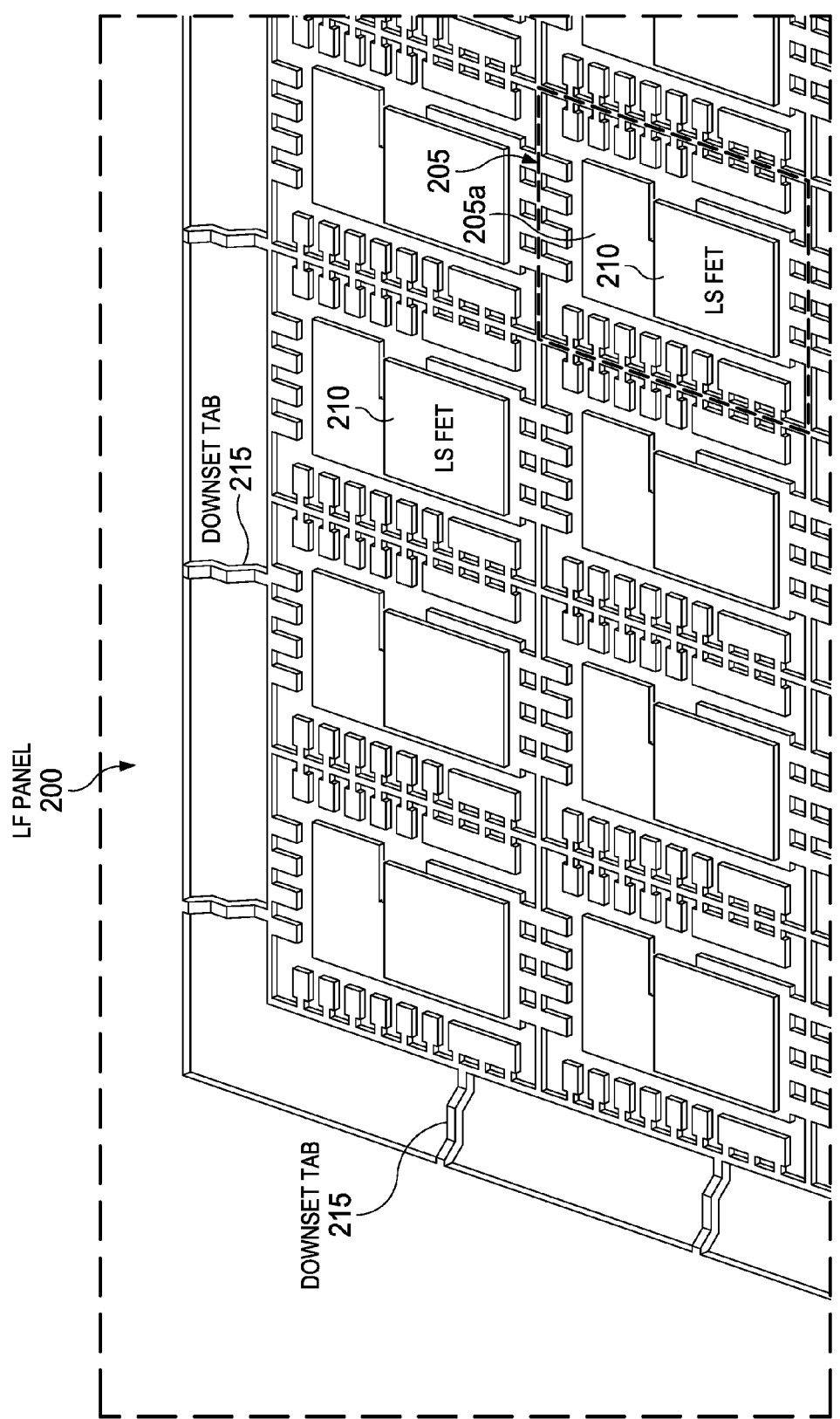
Figure 2B:
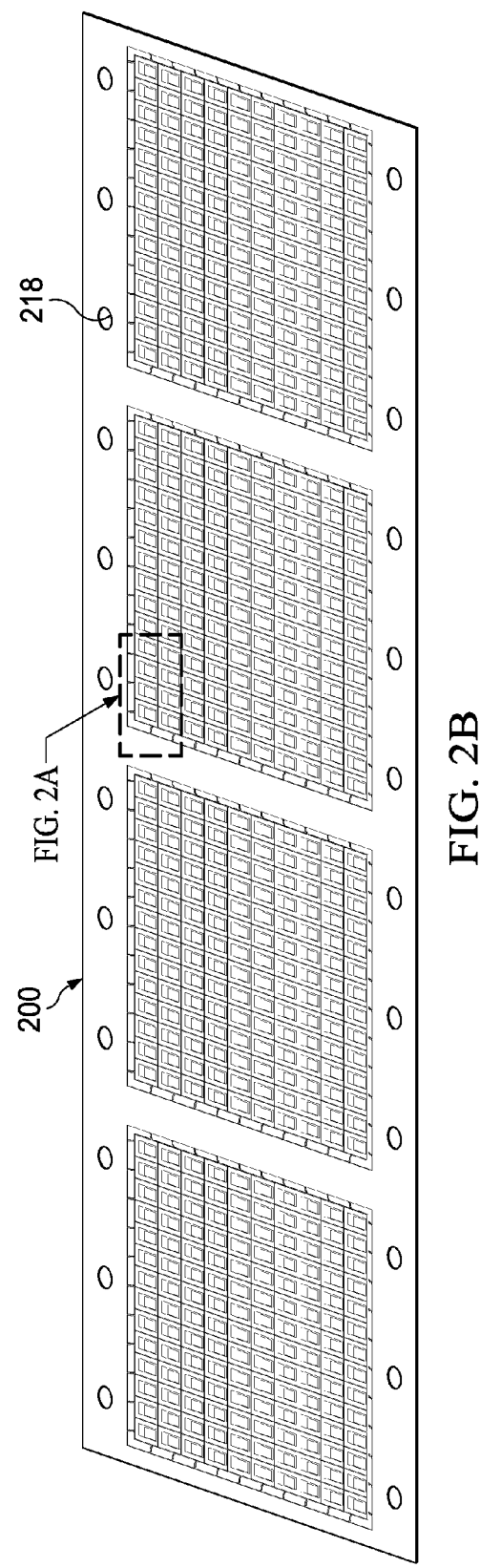
FIG. 2B is a further away perspective depiction of the same, according to an example embodiment.

FIG. 2A is a close-up detailed perspective depiction of a bottom LF panel 200 having a full downset including a plurality of interconnected bottom LFs 205 each with a LS FET 210 attached on a first die attach area 205a of the interconnected LFs, while FIG. 2B is a further away perspective depiction of the same, according to an example embodiment. Downset tabs 215 and alignment holes 218 are shown. A full panel downset is recognized to provide an easier assembly process and better planarity control, as well as easier assembly processing.

Although not shown, there can be an optional metal (e.g. copper) slug under the LS FETS 210. More generally, the vertical transistors for disclosed embodiments can include bipolars including thyristors (pair of tightly coupled bipolar junction transistors also called silicon controlled rectifiers), junction gate field-effect transistors (JFETs), and a variety of vertical MOSFETs including double-diffused metal-oxide-semiconductor (DMOS), High-electron-mobility transistors (HEMTs, such as a GaN HEMT), as well as Insulated Gate Bipolar Transistors (IGBTs),In the case of FETs, the FETs can comprise p-channel or n-channel FETs.

Figure 3A:
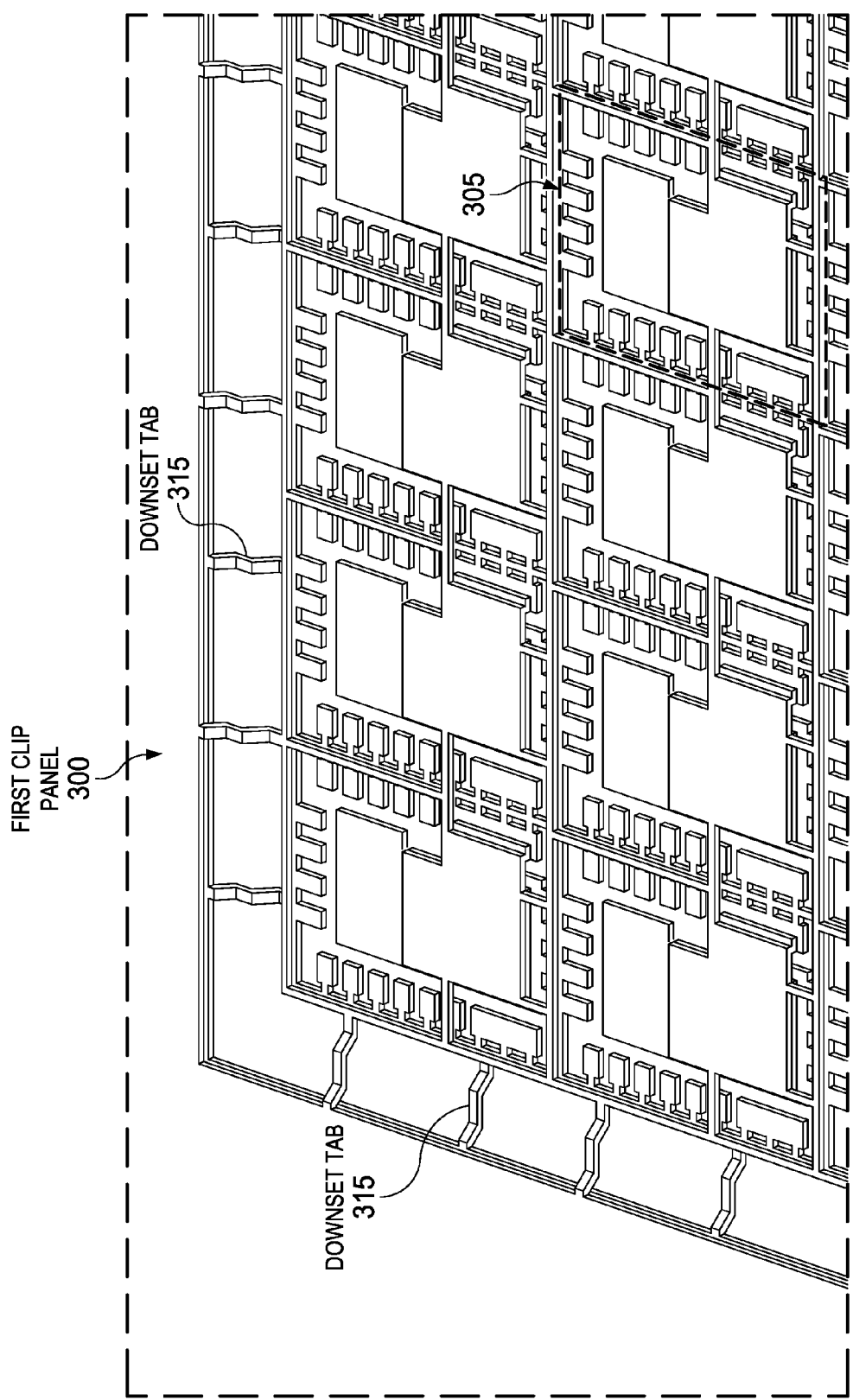
FIG. 3A is a close-up detailed perspective depiction of a downset first clip panel having a full downset including a plurality of interconnected clips.
Figure 3B:
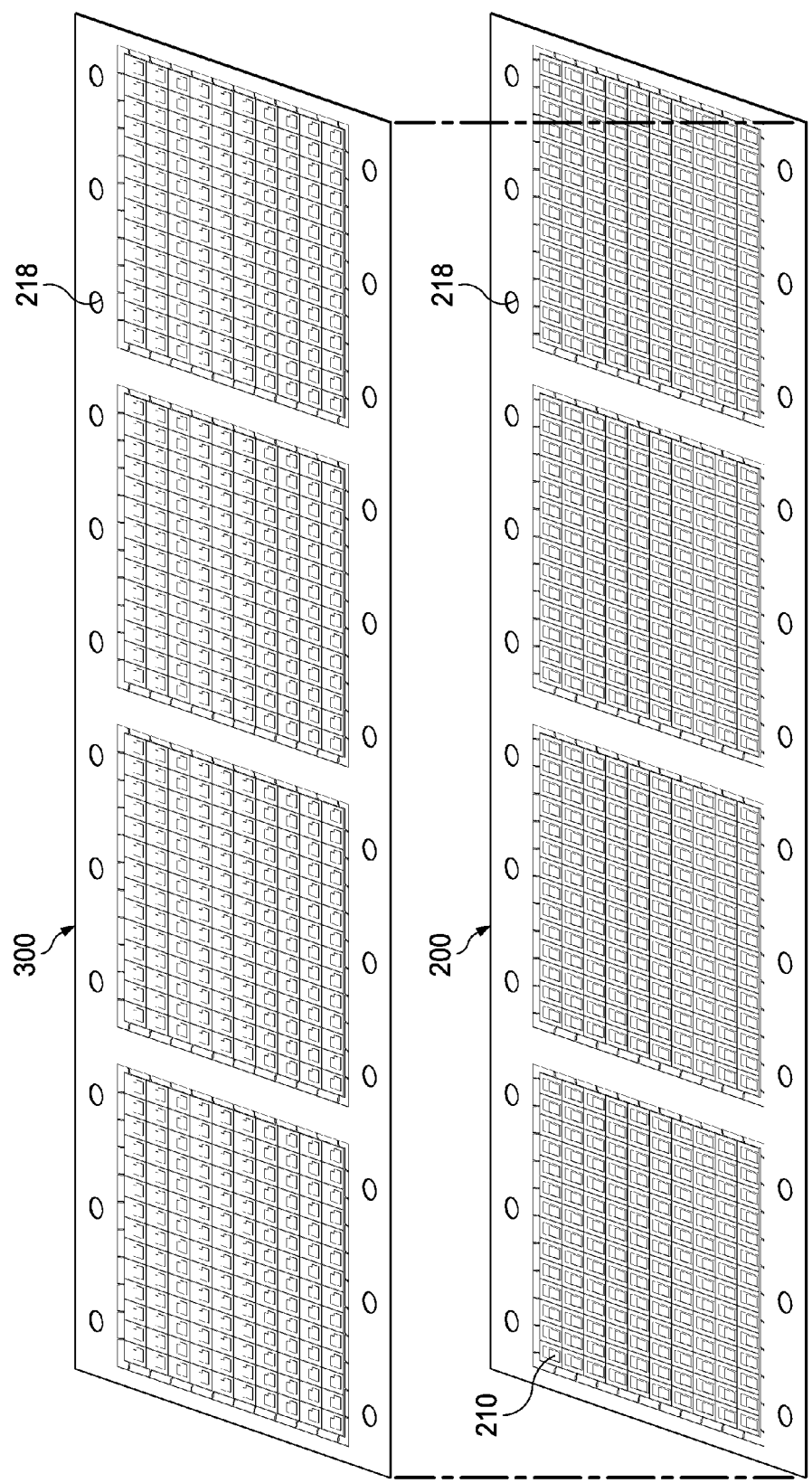
FIG. 3B depicts the mating of the downset first clip panel onto the bottom LF panel having the LS FETs thereon, according to an example embodiment.

FIG. 3A is a close-up detailed perspective depiction of a downset first clip panel 300 having a full downset including a plurality of interconnected first clips 305 with the downset tabs shown as 315, and FIG. 3B depicts the mating of the downset first clip panel onto the bottom LF panel having the LS FETs thereon, according to an example embodiment. The alignment holes 218 shown in FIG. 3B are used for the alignment during mating. The metal clip panel can comprise copper (or other suitable metal) to provide high electrical conductivity and low thermal resistance. Units in the clip panel are more rigid because they are connected together as compared to conventional individual clopper clips which are recognized to be fragile and tend to move around and rotate after being attached to the LF and die. The bottom LF panel 200 and first clip panel 300 are generally downset to a different extent defined herein as being at least 2 mils different, such as to accommodate different chip and package thickness, for example for a die thickness which can generally range from 8 mils (=203.2 µms) to 20 mils (=508 µms).

Figure 4A:
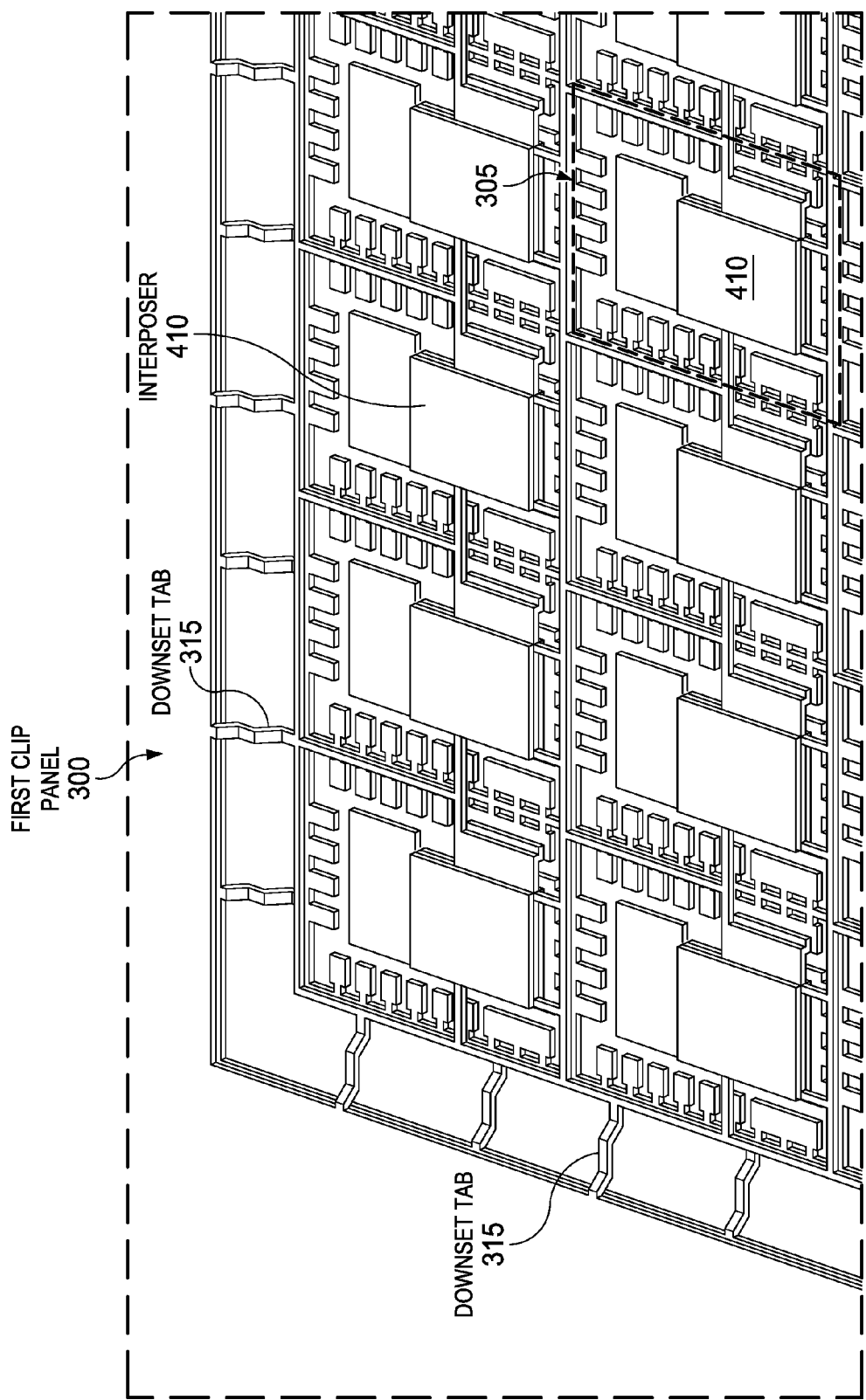
Figure 5A:
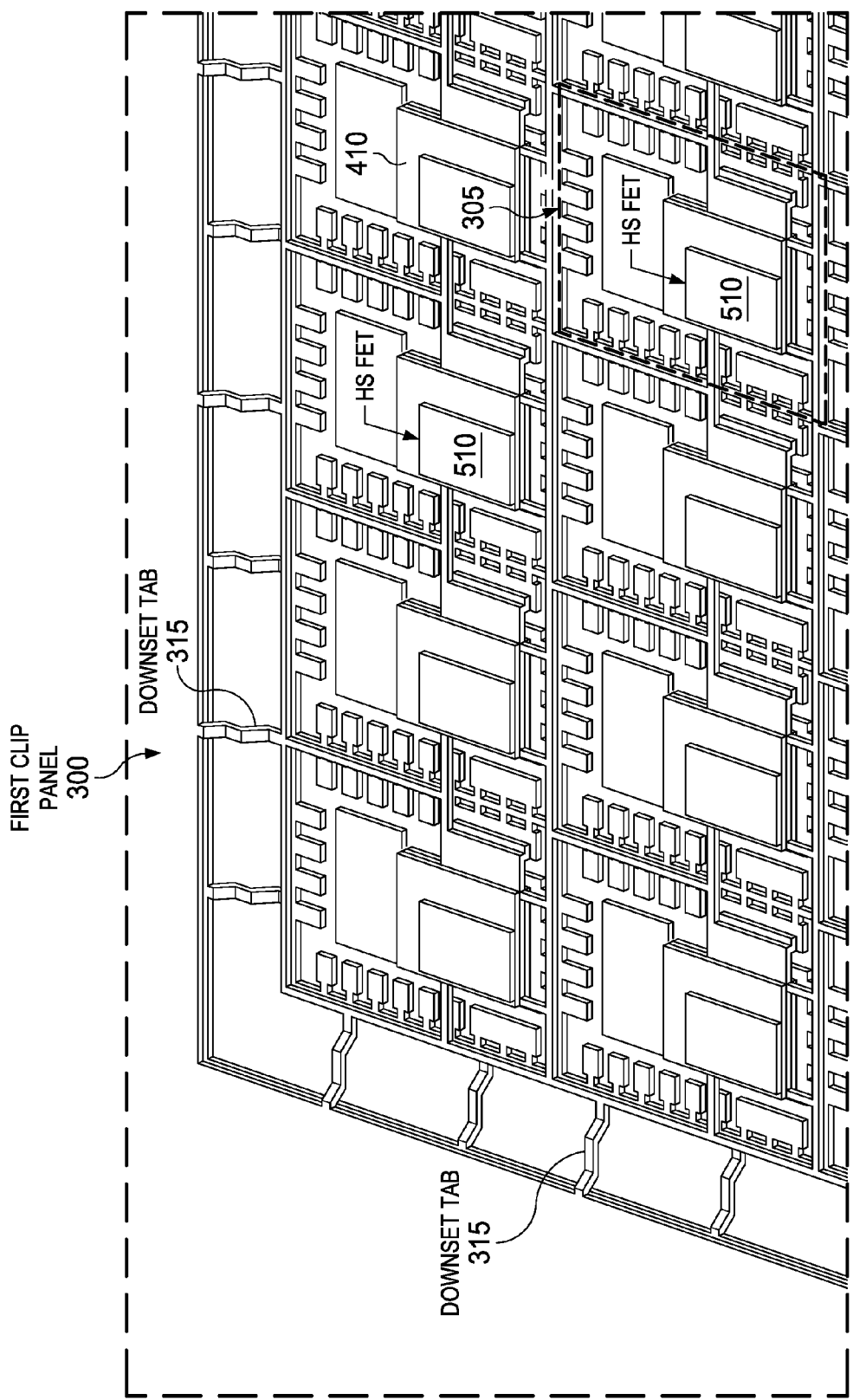

FIG. 4A is a close-up detailed perspective depiction of interposers 410 on the first clips 305 of the downset first clip panel over the LS FETs, while FIG. 4B is a further away perspective depiction of the same, according to an example embodiment. FIG. 5A is a close-up detailed perspective depiction of HS FETs 510 attached onto the interposers 410 on the first clips 305 of the downset first clip panel 300, while FIG. 5B is a further away perspective depiction of the same, according to an example embodiment.

Figure 6A:
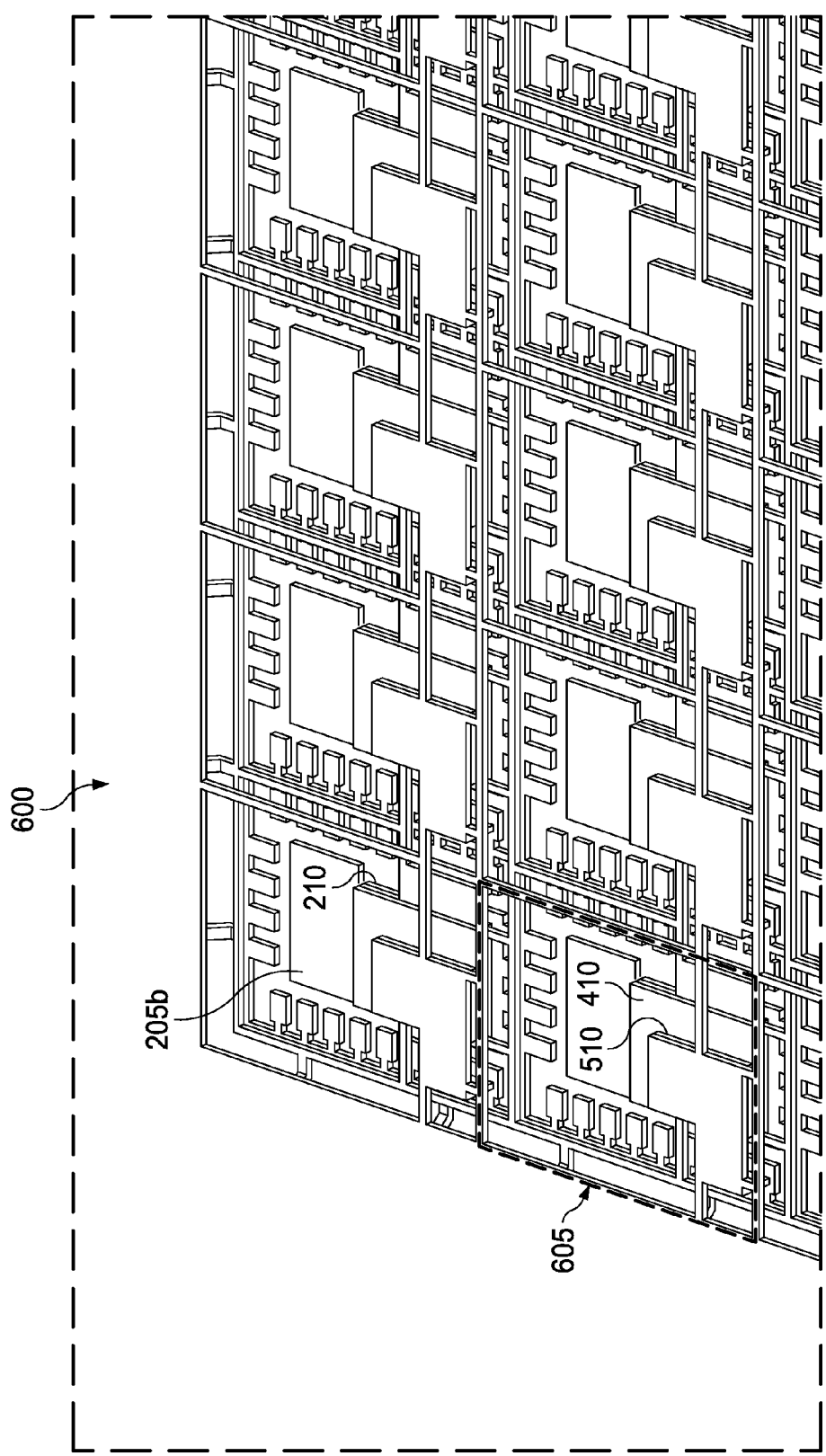
Figure 6B:
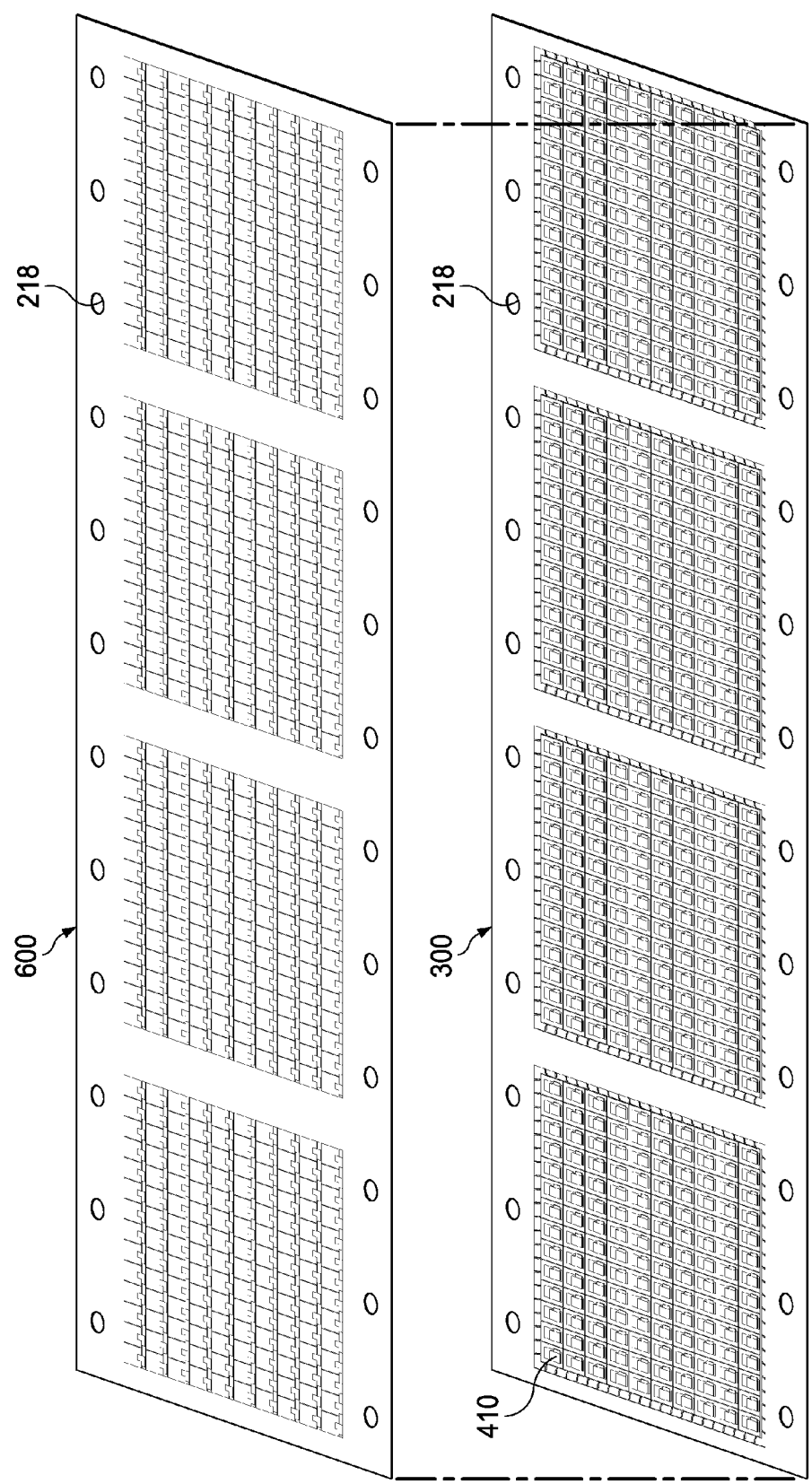
FIG. 6B depicts the mating of the second clip panel to the downset first clip panel, according to an example embodiment.

FIG. 6A is a close-up detailed perspective depiction of a second clip panel 600 having second clips 605 mated over the HS FET 510 on the interposer 410 to the first clip panel 300 and to the bottom LF panel 200 with its second die attach area 205b shown, while FIG. 6B depicts the mating of the second clip panel 600 to the downset first clip panel 300, according to an example embodiment. The panel-to-panel assembly and mating process improves output and reduces process complexity. A more solid assembly compared to singulated unit assembly processes is provided as the LF panel 200 and the respective clips panels 300 and 600 are mated together.

LF panel to clip panel mating is generally performed using a jig. A jig is generally made out of materials such as aluminum, stainless steel, or plastic fiber. The jig is designed to be rectangular in shape to match the LF panel and clip panels, but of slightly larger size. At theperipheral longer side of the jig there are protrusions of pin needles. As described above, the LF panel and clip panels side rails include alignment holes 218 generally on the longer side of the LF and clip panels at essentially the same position (within manufacturing tolerance), so that optical methods can be used so that the LF and clip panels are aligned together to enable the pin needles to be inserted through the alignment holes 218 in the stacked clips and LFs.

Thus, to mate the LF panel 200 and clip panels 300 and 600, the LF panel 200 and clip panels 300 and 600 are placed on jig by aligning the pin needles to alignment holes 218 on LFs and guiding the pin needles through alignment holes of LFs. At end of mating process, the bottom LF 200 and the first clip panel 300 and the second clip panel 600 are all placed on the jig with pin needles going through all alignment holes 218 of leadframes in parallel and in alignment to one another.

Figure 6C:
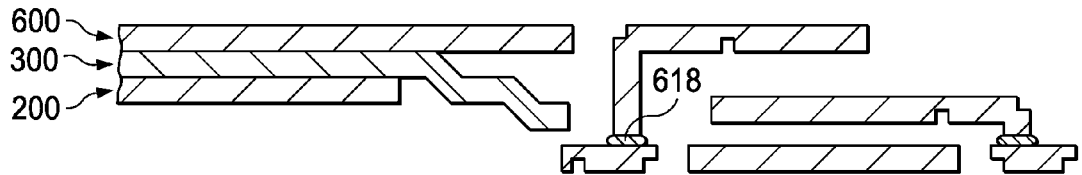
FIG. 6C is a cross sectional view that depicts metal epoxy or solder paste applied to areas as shown to provide electrical contact between the respective clips on the second clip panel to the bottom LF and between respective clips on the downset first clip panel to the bottom LF, so that they each stick together and form an electrical connection path.

FIG. 6C is a cross sectional view that depicts metal (e.g. silver) epoxy or solder paste 618 applied to areas as shown to provide contact between the respective clips on the second clip panel 600 to the bottom LF panel 200 and between respective clips on the downset first clip panel 300 to the bottom LF panel 200, so that they each stick together and form an electrical connection path. As described above, although not always shown, there is generally solder between the clips contact portions and the semiconductor die.

Figure 7C:
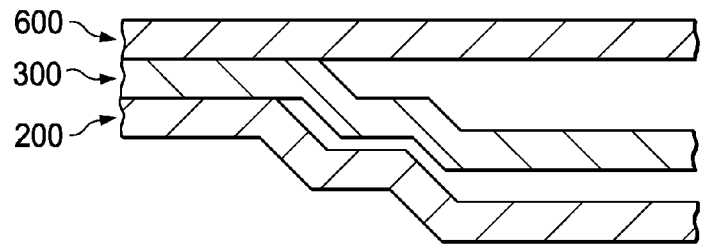
FIG. 7C is a cross sectional depiction of the assembly of the second clip on a first clip on a bottom LF, according to an example embodiment.
Figure 7A:
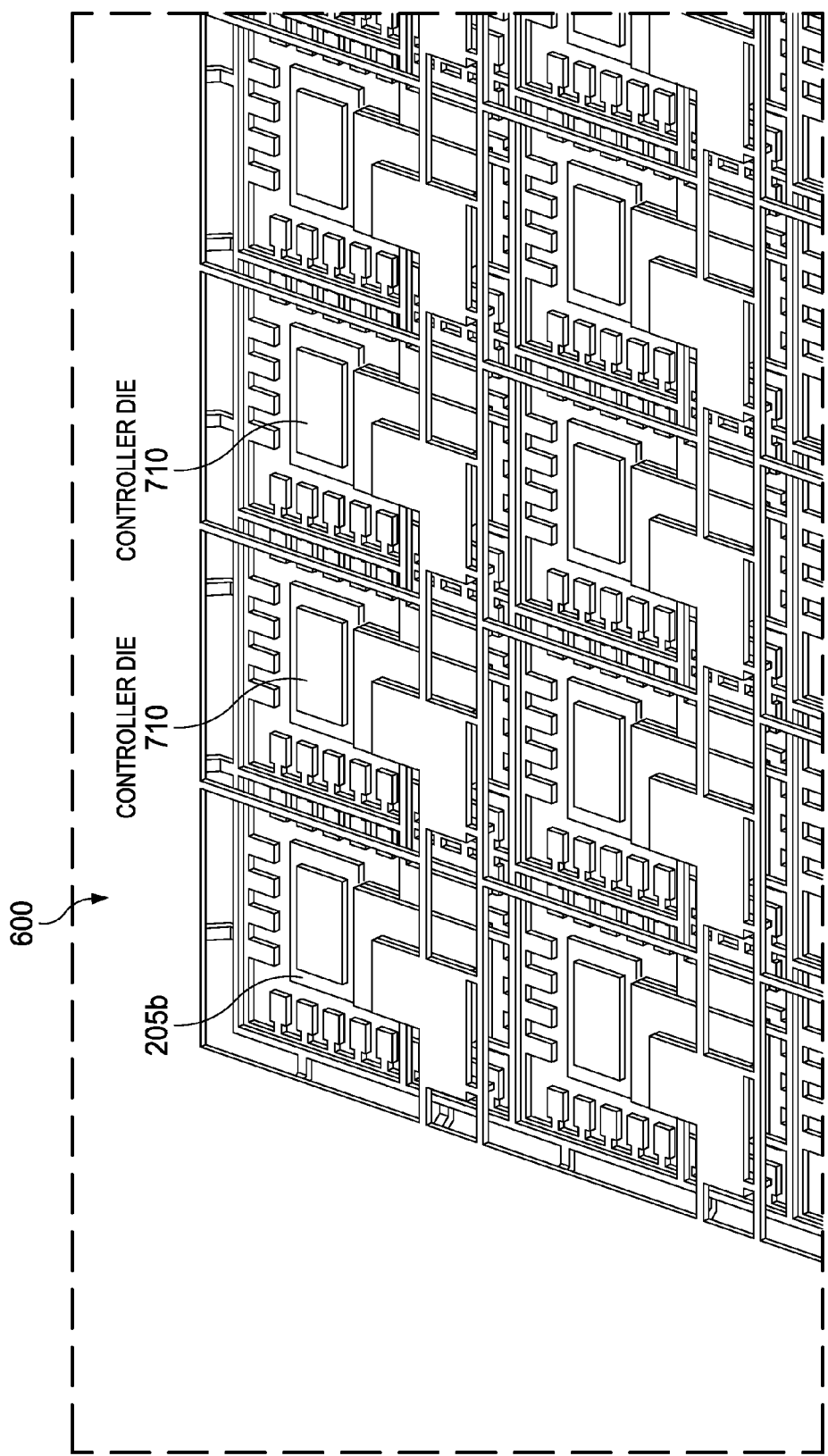
FIG. 7A depicts a close-up detailed perspective depiction of a controller die attached to the second die attach area of the LFs of the bottom LF panel.
Figure 7B:
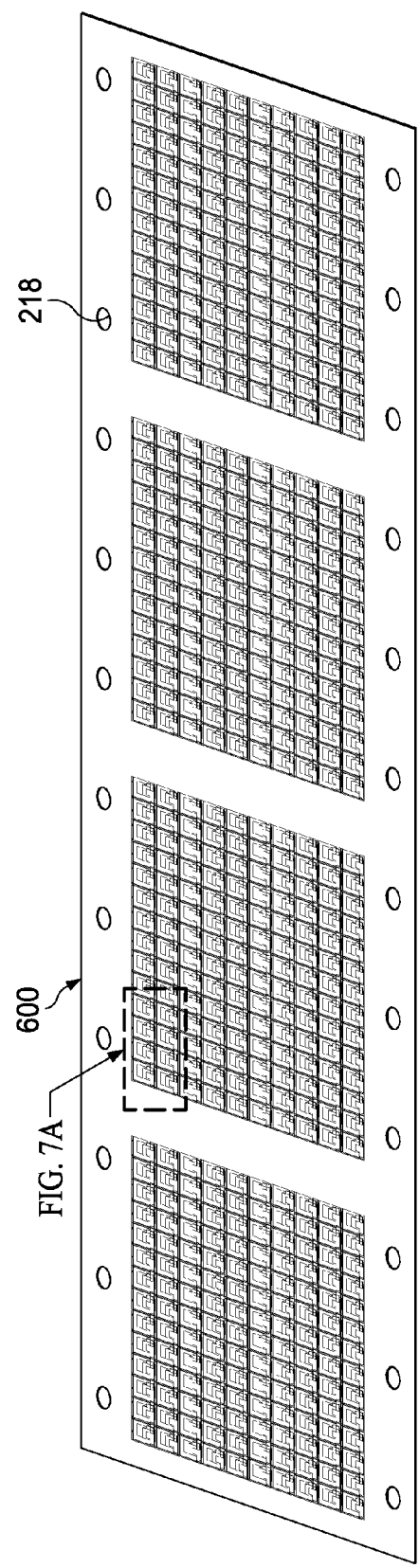
FIG. 7B is a further away perspective depiction of the same.

FIG. 7A depicts a close-up detailed perspective depiction of a controller die 710 attached to the second die attach area 205b of the LFs 205 of the bottom LF panel 200, while FIG. 7B is a further away perspective depiction of the same. Wire bonding to bond pads on the controller die 710 generally follows. FIG. 7C is a cross sectional depiction of the assembly of a second clip of the second clip panel 600, on a first clip of the first clip panel 300 on a bottom LF 205 of the bottom LF panel 200, according to an example embodiment.

Figure 8A:
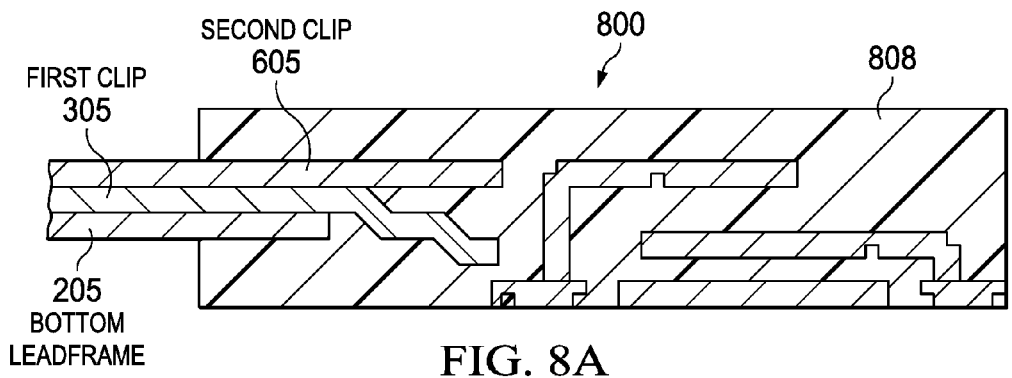

FIG. 8A depicts a side view of a MCM unit 800 after molding including the second clip 605 on the first clip 305 on the bottom LF 205. Mold is shown as 808. A compressible downset DAP prevents mold flash and ensures good connections between each layer of the stack up. The exposed pad of the bottom LF 205 shown is a standard part of TDFN and QFN packages which generally always have exposed pads for increasing the maximum power dissipation rating of the package. The material of the bottom LF 205 can be copper alloys such as A194, EFTEC, or C7025, having a typical thickness from 0.15 mm to 0.4 mm. The materials for clips can be the same as for the LFs, such as copper or a copper alloy.

Figure 8B:
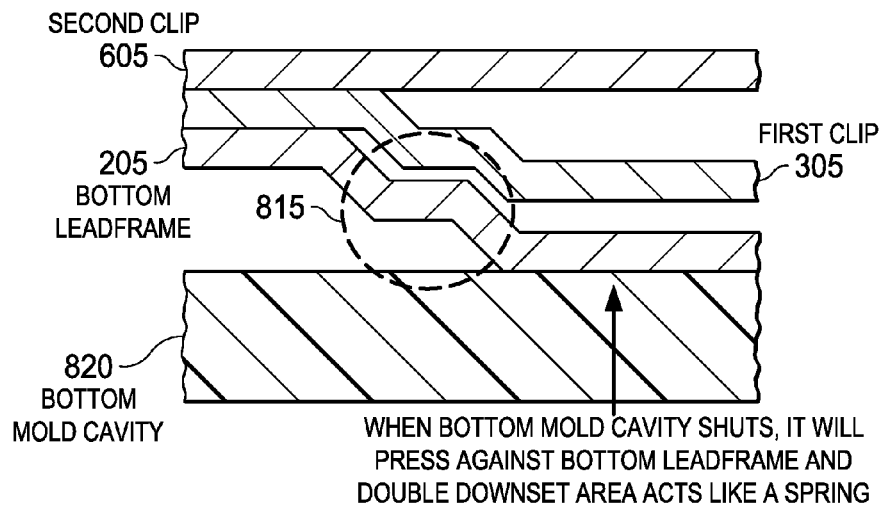
FIG. 8B depicts the spring action of the bottom LF and the first clips against the bottom mold cavity during molding, according to an example embodiment.

FIG. 8B depicts the spring action due to the downset of the bottom LF 205 and the first clip 305 against the bottom mold cavity 820 during molding, according to an example embodiment. The double downset area 815 acts like a spring. When the bottom mold cavity 820 shuts, it presses against the bottom LF 205 and the double downset area 815 acts like a spring to ensure no mold compound slips in between the bottom mold cavity 820 and the bottom LF 205 to prevent mold flash. The amount of the flexure can be from 0.025 mm to 0.075 mm, but disclosed embodiments are not limited to these values in this range depending on the particular application.

Figure 9A:
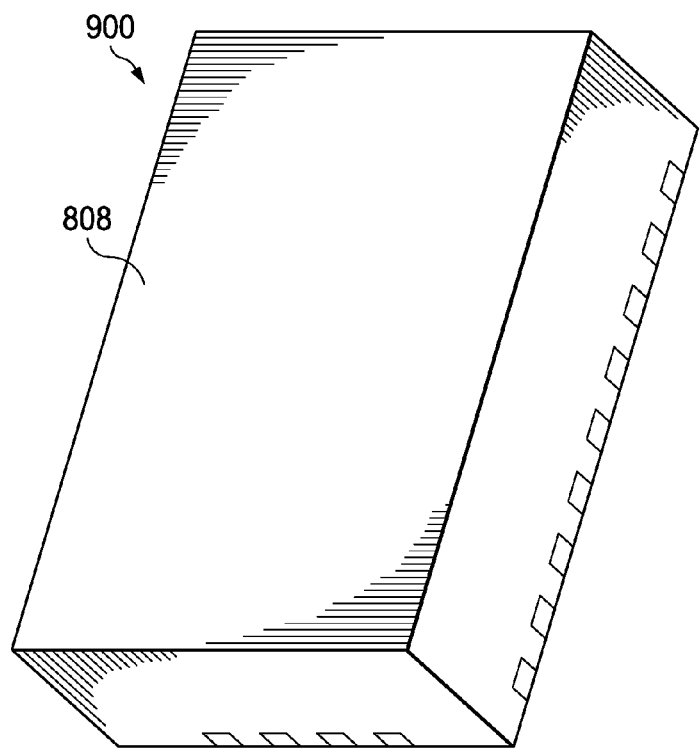
FIG. 9A depicts a top view and FIG. 9B a bottom perspective view of an example completed singulated MCM power package after package sawing, according to an example embodiment.
Figure 9B:
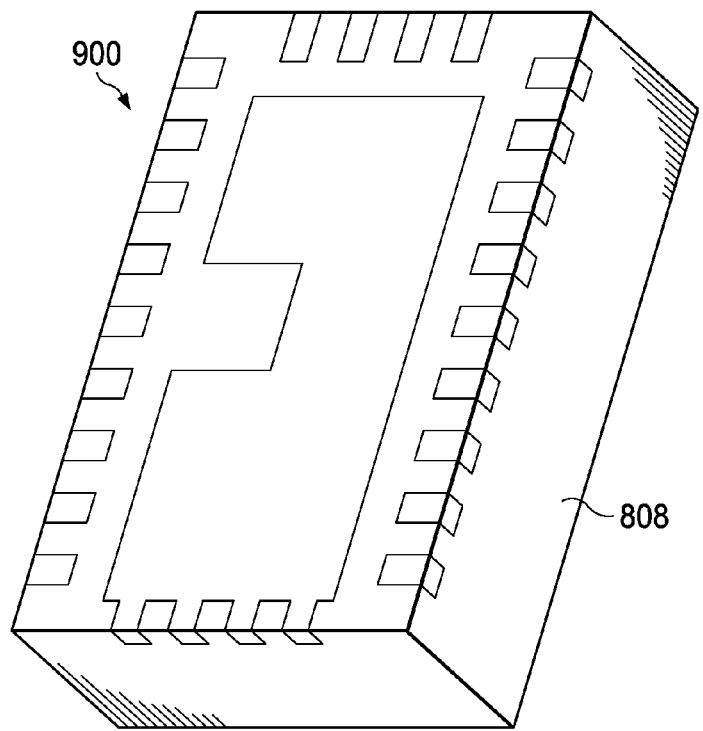

FIG. 9A depicts a top view and FIG. 9B a bottom perspective view of a completed singulated MCM power package 900 after package sawing, according to an example embodiment. Mold is shown as 808.

Advantages of disclosed embodiments include a significantly easier assembly process with the disclosed triple LF/clip panel stack up concept. Only known tools and machines are generally needed. Rigid and more robust assembly is provided which can withstand handling problems. A faster assembly process and higher output/unit per hour (UPH) because of less pick & place processing. A generally more simple design with all the units and clips populated with same standard LF and clip size. Good clip positioning within all units per strip as all the alignments are performed during design to provide alignment holes enabling the LF and clip panel mating process(es). A good stack up connection is also provided enabled by the above described compressible panel designs.

Disclosed embodiments can be integrated into a variety of assembly flows to form a variety of different packaged semiconductor integrated circuit (IC) devices and related products. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method for forming a panel of stacked semiconductor packages, comprising:
    providing a bottom leadframe (LF) panel including an interconnected plurality of LFs downset each including at least a first die attach area, and a plurality of terminals;
    attaching a plurality of low side (LS) transistors to said first die attach area;
    placing a first clip panel including a plurality of first clips downset and interconnected on said bottom LF panel;
    attaching a dielectric interposer (interposer) on each of said plurality of first clips over said LS transistors;
    attaching a plurality of high side (HS) transistors on said interposers, and
    mating a second clip panel including a plurality of second clips to interconnect to said HS transistors including mating together said second clip panel, said first clip panel and said bottom LF panel.

2. The method of claim 1, wherein said plurality of LFs further include a second die attach area, further comprising after said mating:
    attaching a controller die on each of said second die attach area, and
    wire bonding bond pads of said controller die to ones of said plurality of terminals.

3. The method of claim 1, further comprising molding with a mold material and then sawing to form a plurality of said stacked semiconductor packages, wherein a flexure of said LFs and said first clips during said molding is at least 0.025 mm.

4. The method of claim 1, wherein said LFs and said first clips are downset to a different extent.

5. The method of claim 1, wherein said bottom LF panel, said first clip panel and said second clip panel all have alignment holes in at least one of their rails, and wherein said mating utilizes said alignment holes for alignment.

6. The method of claim 1, wherein said bottom LF panel comprises a Quad Flat No Lead (QFN) or a dual-flat no-lead (DFN).

7. The method of claim 1, wherein said LS and said HS transistors both comprise field effect transistors (FETs).

8. The method of claim 1, wherein the first clip panel comprises a plurality of interconnected first clips.

9. The method of claim 8, wherein the second clip panel comprises a plurality of interconnected second clips.

10. The method of claim 1, wherein the second clip panel comprises a plurality of interconnected second clips.

\* \* \* \* \*